United States Patent
Hwang et al.

(10) Patent No.: US 7,297,450 B2
(45) Date of Patent: *Nov. 20, 2007

(54) OPTICAL PROXIMITY CORRECTION METHOD

(75) Inventors: Jiunn-Ren Hwang, Hsin-Chu (TW); Jui-Tsen Huang, Taipei (TW); Chang-Jyh Hsieh, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/380,192

(22) Filed: Apr. 25, 2006

(65) Prior Publication Data

US 2006/0183031 A1    Aug. 17, 2006

Related U.S. Application Data (63) Continuation of application No. 10/711,198, filed on Sep. 1, 2004, now Pat. No. 7,063,923, which is a continuation-in-part of application No. 10/064,413, filed on Jul. 11, 2002, now abandoned.

(51) Int. Cl.
*G03F 9/00* (2006.01)
(52) U.S. Cl. ............................................. 430/5; 430/30
(58) Field of Classification Search .................... 430/5, 430/30

See application file for complete search history.

(56) References Cited

U.S. PATENT DOCUMENTS 7,063,923 B2 *   6/2006   Hwang et al. .................. 430/5

* cited by examiner

*Primary Examiner*—Christopher G. Young
(74) *Attorney, Agent, or Firm*—Winston Hsu (57) ABSTRACT

An integrated circuit layout includes dense figures and at least one isolated figure. A plurality of dummy patterns are formed to surround the isolated figure, so as to reduce the difference in pattern density of the integrated circuit layout. A transmitted light of the dummy patterns provides a phase difference of 0 or 180 degrees relative to a transmitted light of the integrated circuit layout. The integrated circuit layout and the plurality of dummy patterns are formed on a photo-mask.

28 Claims, 6 Drawing Sheets

OPTICAL PROXIMITY CORRECTION METHOD

CROSS REFERENCE TO RELATED APPLICATIONS

This is a continuation application of U.S. application Ser. No. 10/711,198, filed Sep. 1, 2004, now U.S. Pat. No. 7,063,923 which itself is a continuation-in-part of U.S. application Ser. No. 10/064,413, filed on Jul. 11, 2002 now abandoned.

BACKGROUND OF THE INVENTION

1. Field of the Invention

The present invention relates to an optical proximity correction (OPC) method, and more particularly, to an OPC method using dummy patterns to reduce the difference in pattern density.

2. Description of the Prior Art

In semiconductor manufacturing processes, in order to transfer an integrated circuit layout onto a semiconductor wafer, the integrated circuit layout is first designed and formed as a photo-mask pattern. The photo-mask pattern is then proportionally transferred to a photoresist layer positioned on the semiconductor wafer.

As the design pattern of integrated circuit becomes smaller and due to the resolution limit of the optical exposure tool, optical proximity effect will easily occur during the photolithographic process for transferring the photo-mask pattern with higher density. The optical proximity effect will cause defects when transferring the photo-mask pattern, such as right-angled corner rounding, line end shortening, and line width increasing/decreasing. U.S. Pat. No. 6,042,973 to Pierrat and U.S. Pat. No. 6,077,630 to Pierrat describe forming a subresolution grating composed of approximately circular contacts around the border of the primary patter of a photo-mask. As a result, resolution at the edges of the photo-mask pattern is improved when the pattern is printed on a wafer surface. However, the subresolution grating is not able to suppress the optical proximity effect when transferring the photo-mask pattern. Therefore, in order to avoid the above-mentioned defects caused by the optical proximity effect, the semiconductor process uses a computer system to perform an optical proximity correction (OPC) method of the integrated circuit layout. The corrected integrated circuit layout is then designed as a photo-mask pattern and is formed on a surface of the photo-mask.

Figure 1:
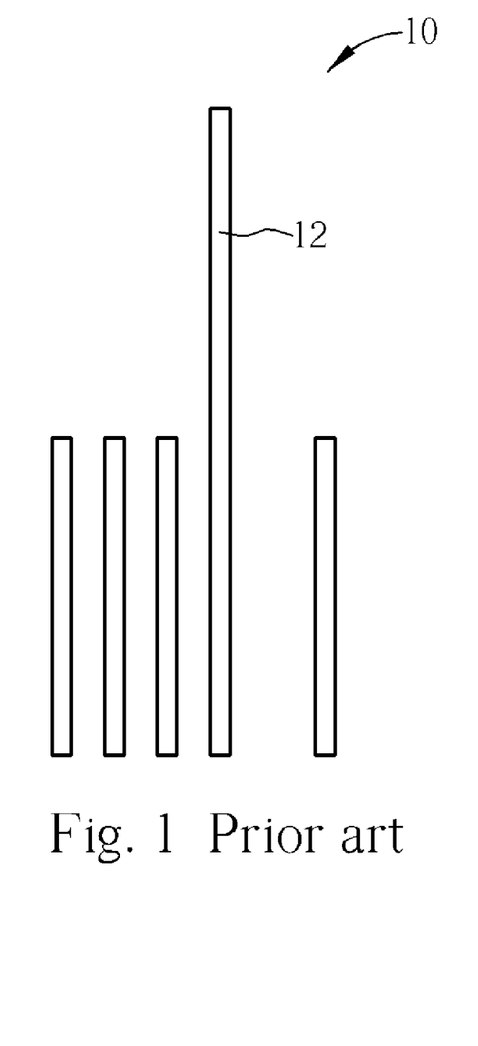
FIG. 1 to FIG. 4 are schematic diagrams of a prior art OPC method.
Figure 2:
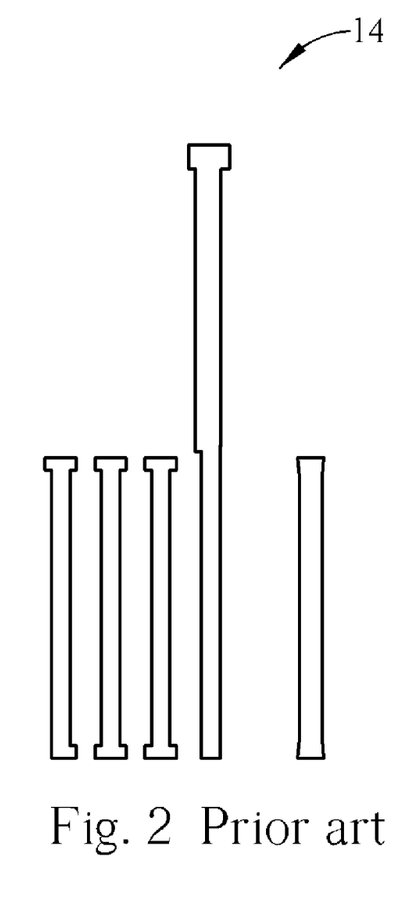
Figure 3:
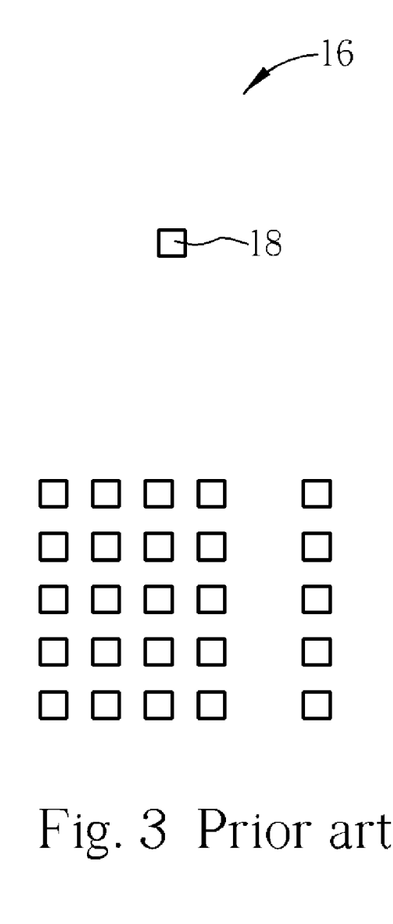
Figure 4:
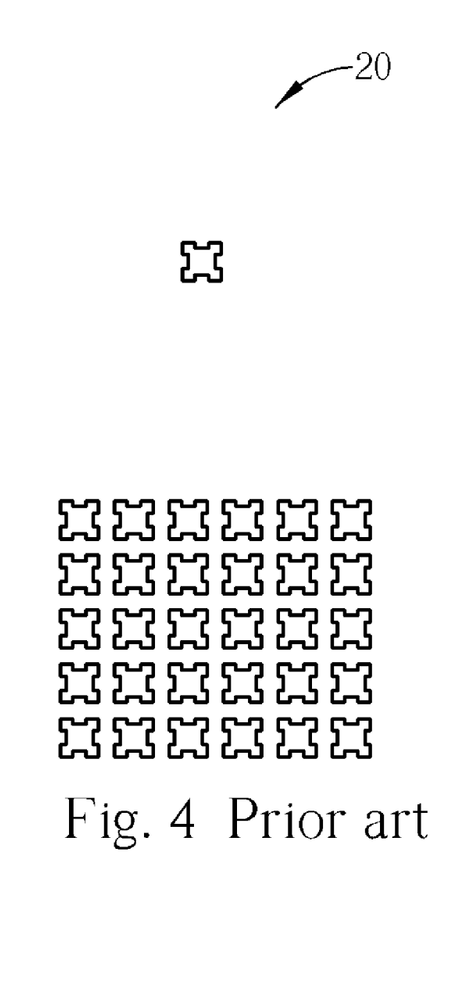

Please refer to FIG. 1 to FIG. 4. FIG. 1 to FIG. 4 are schematic diagrams of a prior art OPC method. As shown in FIG. 1, an original integrated circuit layout 10 comprises a plurality of line FIG. 12 for defining word lines. In order to avoid the defects of line end shortening and line width increasing/decreasing caused by the optical proximity effect when transferring the line FIG. 12, a computer system is used to perform an OPC method of the integrated circuit layout 10. As shown in FIG. 2, the photo-mask pattern 14 is a result of the integrated circuit layout 10 of FIG. 1 after correcting by the prior art OPC method. As well, as shown in FIG. 3, an original integrated circuit layout 16 comprises a plurality of rectangular FIG. 18 for defining doped regions. In order to avoid the defects of right-angled corner rounding caused by the optical proximity effect when transferring the rectangular FIG. 18, a computer system is used to perform an OPC method of the integrated circuit layout 16. As shown in FIG. 4, the photo-mask pattern 20 is a result of the integrated circuit layout 16 of FIG. 3 after correcting by the prior art OPC method.

The prior art OPC method only uses one OPC model to correct the whole integrated circuit layout, and the factor of different pattern density in local regions of the photo-mask resulting in overexposure or underexposure is not taken into consideration. Furthermore, as the system on chip (SOC) is developed, many different kinds of semiconductor devices (such as memory, logic circuits, Input/Output, and central processing unit) are integrated and formed on one chip for substantially reducing costs and improving speed. Therefore, the pattern density of integrated circuit layout is very different in local regions of the chip, and the prior art OPC method is not applicable.

SUMMARY OF THE INVENTION

It is therefore a primary objective of the claimed invention to provide an OPC method for solving the above-mentioned problems.

According to the claimed invention, an optical proximity correction (OPC) method is provided. The method first provides a predetermined integrated circuit layout. The integrated circuit layout is then formed on a surface of a photo-mask, and a plurality of transparent nonprintable dummy patterns are formed outside the integrated circuit layout on the surface of the photo-mask. The plurality of transparent dummy patterns are used to reduce the difference in pattern density on the surface of the photo-mask so as to modify optical proximity effect, and the dummy patterns are not transferred to a photoresist layer formed on a semiconductor wafer during a photolithography process because of a phase difference of 0 or 180 degrees between a transmitted light of the integrated circuit layout and a transmitted light of the dummy patterns.

It is an advantage over the prior art that the OPC method of the claimed invention forms a plurality of nonprintable dummy patterns around an integrated circuit layout predetermined to be transferred on a substrate. The dummy patterns are used to reduce the difference in pattern density of the integrated circuit layout for correcting optical proximity effect. Furthermore, the dummy patterns are designed by performing a simple operation according to conditions of a photolithographic process. Therefore, the time cost of a complicated operation performed by the prior art OPC method can be substantially reduced.

These and other objectives of the claimed invention will no doubt become obvious to those of ordinary skill in the art after reading the following detailed description of the preferred embodiment, which is illustrated in the multiple figures and drawings.

DETAILED DESCRIPTION

Figure 5:
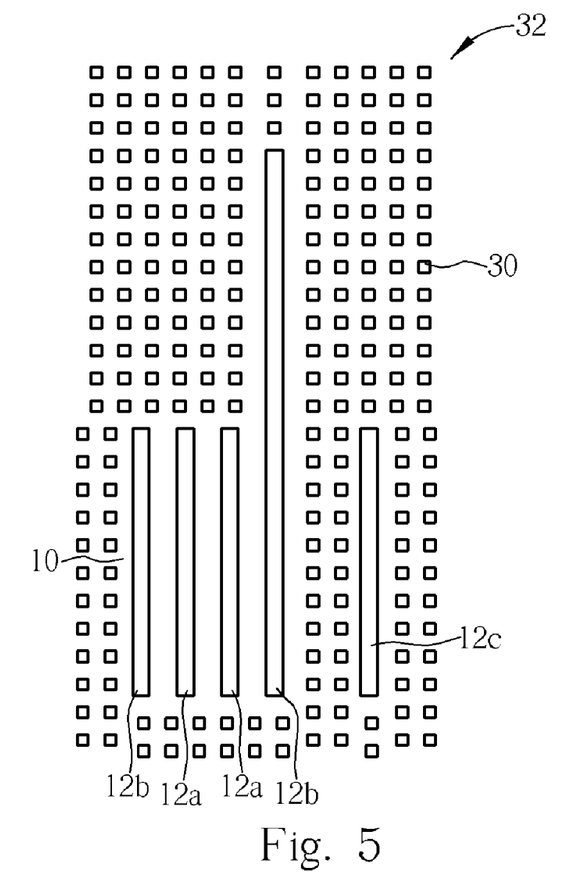
FIG. 5 to FIG. 6 are schematic diagrams of an OPC method according to the present invention method.
Figure 6:
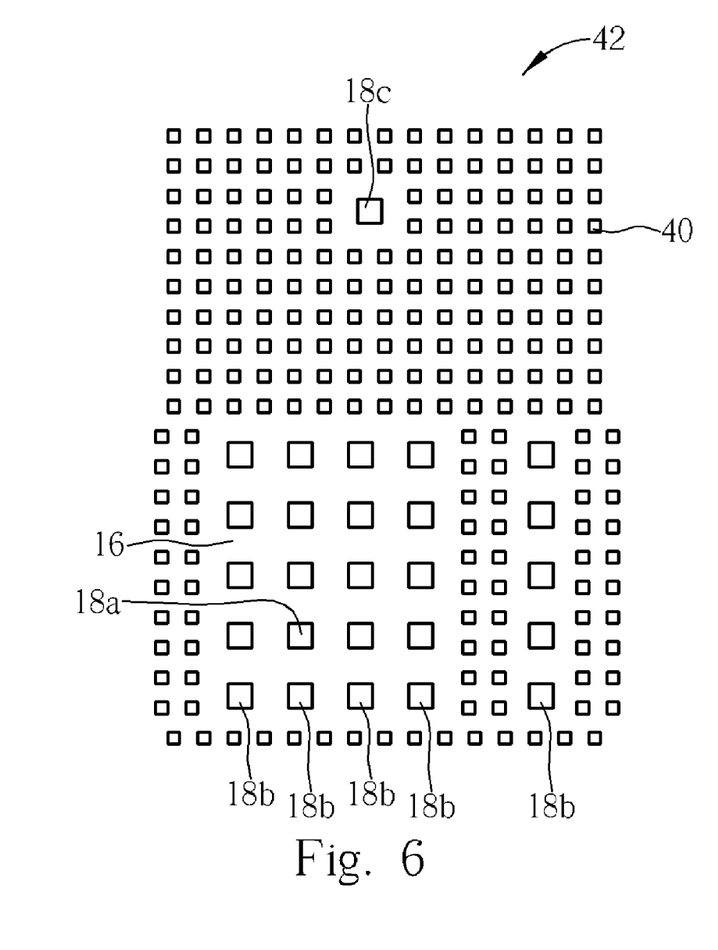

Please refer to FIG. 5 and FIG. 6. FIG. 5 and FIG. 6 respectively depict the integrated circuit layouts 10, 16 of FIG. 1 and FIG. 3 after correcting by an OPC method according to the present invention method. As shown in FIG. 5, according to the present invention method, the integrated circuit layout 10 predetermined to be transferred to a substrate (not shown), such as a semiconductor wafer, is directly formed on a surface of a photo-mask (not shown). The integrated circuit layout 10 includes a plurality of figures, such as dense line FIG. 12*a*, semi-dense line FIG. 12*b* and at least an isolated line FIG. 12*c*. However, the integrated circuit layout 10 is not limited to include line figures only. The integrated circuit layout 10 can include figures in various shapes and in different pattern density according to the present invention.

Moreover, a plurality of dummy patterns 30 of rectangular figures are formed in a blank region outside the integrated circuit layout 10 on the surface of the photo-mask, and the integrated circuit layout 10 and the dummy patterns 30 together compose a photo-mask pattern 32. The dummy patterns 30 are used to reduce the difference in pattern density of the integrated circuit layout 10. For example, the dummy patterns 30 can be formed to surround the isolated line FIG. 12*c*, the semi-dense line FIG. 12*b*, or distributed in other blank regions. In other words, the present invention method first uses a computer system to perform an optical proximity correction of the integrated circuit layout 10 predetermined to be transferred to a substrate by forming a plurality of nonprintable dummy patterns 30 in the blank region outside the integrated circuit layout 10. The integrated circuit layout 10 and the plurality of nonprintable dummy patterns 30 are then simultaneously fabricated on the surface of the photo-mask so as to reduce the difference in pattern density of the integrated circuit layout 10. According to one embodiment of the present invention, the dummy patterns 30 are only fabricated around the integrated circuit layout 10. According to another embodiment of the present invention, the dummy patterns 30 are fabricated and distributed over the blank region outside the integrated circuit layout 10, as shown in FIG. 5.

As well, as shown in FIG. 6, the integrated circuit layout 16 predetermined to be transferred to a substrate is directly formed on a surface of a photo-mask. The integrated circuit layout 16 includes a plurality of figures, such as dense rectangular FIG. 18*a*, semi-dense rectangular FIG. 18*b* and at least an isolated rectangular FIG. 18*c*. However, the integrated circuit layout 16 is not limited to include rectangular figures only. The integrated circuit layout 16 can include figures in various shapes and in different pattern density according to the present invention.

Moreover, a plurality of dummy patterns 40 of rectangular figures are formed outside the integrated circuit layout 16 on the surface of the photo-mask, and the integrated circuit layout 16 and the dummy patterns 40 together compose a photo-mask pattern 42. The dummy patterns 40 are used to reduce the difference in pattern density of the integrated circuit layout 16. For example, the dummy patterns 40 can be formed to surround the isolated rectangular FIG. 18*c*, the semi-dense rectangular FIG. 18*b*, or distributed in other blank regions on the photo-mask.

In another embodiment of the present invention method, a computer system is first used to perform a prior art OPC of the integrated circuit layouts 10, 16 for preventing the pattern transferring defects, such as right-angled corner rounding, line end shortening, and line width increasing/decreasing. A plurality of nonprintable dummy patterns are then formed in a blank region outside the corrected integrated circuit layouts. Finally, the corrected integrated circuit layouts and the plurality of nonprintable dummy patterns are simultaneously fabricated on a surface of a photo-mask so as to reduce the difference in pattern density of the integrated circuit layouts 10, 16.

The integrated circuit layouts 10, 16 of FIG. 5 and FIG. 6 will be transferred from the photo-mask to a photoresist layer formed on a surface of the substrate by a pattern transferring process, such as a photolithographic process. Therefore, in a preferred embodiment of the present invention, the shapes, the dimensions and the numbers of the dummy patterns 30, 40 are designed according to exposure wave length and numerical apertures of the pattern transferring process and the materials included in the photoresist layer for reducing the difference in pattern density of the integrated circuit layouts 10, 16 and modifying the optical proximity effect. Another important design factor of the dummy patterns 30, 40 is that a phase difference of 0 or 180 degrees is detected between a transmitted light of the integrated circuit layout 10, 16 and a transmitted light of the dummy patterns 30, 40, and the dummy patterns 30, 40 will not be transferred to the photoresist layer during the photolithographic process. In FIG. 5 and FIG. 6 for example, the edge length of dummy patterns 30, 40 of rectangular figures is a multiple of exposure wave length, and the multiple is less than 0.6. The distance between each of the dummy patterns 30, 40 is also a multiple of exposure wave length, and the multiple ranges between 0.3 and 2.0. As well, the least distance between the integrated circuit layout 10, 16 and the dummy patterns 30, 40 is a multiple of exposure wave length, and the multiple ranges between 0.4 and 2.0.

Briefly speaking, the OPC method of the claimed invention forms a plurality of nonprintable dummy patterns around an integrated circuit layout predetermined to be transferred to a substrate. The dummy patterns are used to reduce the difference in pattern density of the integrated circuit layout for modifying optical proximity effect. Comparing to the prior art OPC method, the dummy patterns of the present invention are designed by performing a simple operation according to conditions of a photolithographic process. Therefore, the time cost of a complicated operation performed by the prior art OPC method can be substantially reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An optical proximity correction (OPC) method for reducing optical proximity effect occurring in a pattern transferring process, the method comprising:
   providing a photo-mask;
   providing an original photo-mask pattern predetermined to be formed on a surface of the photo-mask, the original photo-mask pattern comprising at least one integrated circuit layout composed of dense figures and at least one isolated figure;
   providing a plurality of dummy patterns to surround the isolated figure to reduce the difference in pattern density of the original photo-mask pattern, a transmitted light of the dummy patterns providing a phase difference of 0 degree relative to a transmitted light of the integrated circuit layout, and the integrated circuit layout and the plurality of dummy patterns together composing a corrected photo-mask pattern; and
   forming the corrected photo-mask pattern on the surface of the photo-mask.

2. The method of claim 1, wherein the integrated circuit layout is transferred to a photoresist layer formed on a surface of a substrate by the pattern transferring process.

3. The method of claim 2, wherein the plurality of dummy patterns are nonprintable dummy patterns and not transferred to the photoresist layer during the pattern transferring process.

4. The method of claim 3, wherein the shapes, the dimensions and the numbers of the dummy patterns ore designed according to exposure wave length and numerical apertures of the pattern transferring process and the materials included in the photoresist layer.

5. The method of claim 4, wherein the edge length of each dummy pattern is a multiple of exposure wave length, and the multiple is less than 0.6.

6. The method of claim 4, wherein the distance between each dummy pattern is a multiple of exposure wave length, and the multiple ranges between 0.3 and 2.0.

7. The method of claim 4, wherein the least distance between the dummy patterns and the integrated circuit layout is a multiple of exposure wave length, the multiple ranges between 0.4 and 2.0.

8. An optical proximity correction method for reducing optical proximity effect occurring in a pattern transferring process, the method comprising:
providing a photo-mask;
providing an integrated circuit layout predetermined to be formed on a surface of the photo-mask, the integrated circuit layout comprising dense figures and at least one isolated figure;
performing a partial OPC of the integrated circuit layout for obtaining a corrected integrated circuit layout; and
forming the corrected integrated circuit layout on the surface of the photo-mask and forming a plurality of dummy patterns surrounding the isolated figure, the dummy patterns being capable of reducing the difference in pattern density of the corrected integrated circuit layout, and a transmitted light of the dummy patterns providing a phase difference of 0 degree relative to a transmitted light of the corrected integrated circuit layout.

9. The method of claim 8, wherein the partial OPC is used to modify pattern transferring defects of the integrated circuit layout comprising right-angled corner rounding, line end shortening, and line width increasing/decreasing.

10. The method of claim 8, wherein the plurality of dummy patterns are nonprintable dummy patterns and not transferred to a photoresist layer formed an a surface of a substrate during the pattern transferring process, however, the integrated circuit layout is transferred to the photoresist layer by the pattern transferring process.

11. The method of claim 10, wherein the shapes, the dimensions and the numbers of the dummy patterns are designed according to exposure wave length and numerical apertures of the pattern transferring process and the materials included in the photoresist layer.

12. The method of claim 11, wherein the edge length of each dummy pattern is a multiple of exposure wave length, and the multiple is less than 0.6.

13. The method of claim 11, wherein the distance between each dummy pattern is a multiple of exposure wave length, and the multiple ranges between 0.3 and 2.0.

14. The method of claim 11, wherein the least distance between the dummy patterns and the integrated circuit layout is a multiple of exposure wave length, the multiple ranges between 0.4 and 2.0.

15. An optical proximity correction (OPC) method for reducing optical proximity effect occurring in a pattern transferring process, the method comprising:
providing a photo-mask;
providing an original photo-mask pattern predetermined to be formed on a surface of the photo-mask, the original photo-mask pattern comprising at least one integrated circuit layout composed of dense figures and at least one isolated figure;
providing a plurality of dummy patterns to surround the isolated figure to reduce the difference in pattern density of the original photo-mask pattern, and the integrated circuit layout and the plurality of dummy patterns together composing a corrected photo-mask pattern; and
forming the corrected photo-mask pattern on the surface of the photo-mask.

16. The method of claim 15, wherein the integrated circuit layout is transferred to a photoresist layer formed on a surface of a substrate by the pattern transferring process.

17. The method of claim 16, wherein the plurality of dummy patterns are nonprintable dummy patterns and not transferred to the photoresist layer during the pattern transferring process.

18. The method of claim 17, wherein the shapes, the dimensions and the numbers of the dummy patterns are designed according to exposure wave length and numerical apertures of the pattern transferring process and the materials included in the photoresist layer.

19. The method of claim 18, wherein the edge length of each dummy pattern is a multiple of exposure wave length, and the multiple is less than 0.6.

20. The method of claim 18, wherein the distance between each dummy pattern is a multiple of exposure wave length, and the multiple ranges between 0.3 and 2.0.

21. The method of claim 18, wherein the least distance between the dummy patterns and the integrated circuit layout is a multiple of exposure wave length, the multiple ranges between 0.4 and 2.0.

22. An optical proximity correction method for reducing optical proximity effect occurring in a pattern transferring process, the method comprising:
providing a photo-mask;
providing an integrated circuit layout predetermined to be formed on a surface of the photo-mask, the integrated circuit layout comprising dense figures and at least one isolated figure;
performing a partial OPC of the integrated circuit layout for obtaining a corrected integrated circuit layout; and
forming the corrected integrated circuit layout on the surface of the photo-mask and forming a plurality of dummy patterns surrounding the isolated figure, and the dummy patterns being capable of reducing the difference in pattern density of the corrected integrated circuit layout.

23. The method of claim 22, wherein the partial OPC is used to modify pattern transferring defects of the integrated circuit layout comprising right-angled corner rounding, line end shortening, and line width increasing/decreasing.

24. The method of claim 22, wherein the plurality of dummy patterns are nonprintable dummy patterns and not transferred to a photoresist layer formed on a surface of a substrate during the pattern transferring process, however, the integrated circuit layout is transferred to the photoresist layer by the pattern transferring process.

25. The method of claim 24, wherein the shapes, the dimensions and the numbers of the dummy patterns are designed according to exposure wave length and numerical apertures of the pattern transferring process and the materials included in the photoresist layer.

26. The method of claim 25, wherein the edge length of each dummy pattern is a multiple of exposure wave length, and the multiple is less than 0.6.

27. The method of claim 25, wherein the distance between each dummy pattern is a multiple of exposure wave length, and the multiple ranges between 0.3 and 2.0.

28. The method of claim 25, wherein the least distance between the dummy patterns and the integrated circuit layout is a multiple of exposure wave length, the multiple ranges between 0.4 and 2.0.

* * * * *